United States Patent
Liu et al.

[19]

[11] Patent Number: 5,956,618
[45] Date of Patent: Sep. 21, 1999

[54] PROCESS FOR PRODUCING MULTI-LEVEL METALLIZATION IN AN INTEGRATED CIRCUIT

[75] Inventors: Chun-Ting Liu, Berkeley Heights, N.J.; Kuo-Hua Lee, Orlando, Fla.; Ruichen Liu, Warren, N.J.

[73] Assignee: Lucent Technologies Inc., Murray Hill, N.J.

[21] Appl. No.: 08/828,155

[22] Filed: Mar. 27, 1997

Related U.S. Application Data

[63] Continuation of application No. 08/514,902, Aug. 14, 1995, which is a continuation of application No. 08/336,451, Nov. 9, 1994.

[51] Int. Cl.$^6$ .................... H01L 21/027; H01L 21/304
[52] U.S. Cl. ................. 438/926; 438/183; 438/626; 438/631; 438/599; 438/645; 438/691; 438/942
[58] Field of Search .................... 438/926, 321, 438/622, 626, 692, 631, 633, 641, 599, 645, 183, 942, 945

[56] References Cited

U.S. PATENT DOCUMENTS

| | | | |
|---|---|---|---|
| 5,112,761 | 5/1992 | Matthews | 437/228 |
| 5,182,235 | 1/1993 | Eguchi | 437/187 |
| 5,281,555 | 1/1994 | Cho | 437/195 |
| 5,292,689 | 3/1994 | Cronin et al. | 437/228 |
| 5,371,032 | 12/1994 | Nishihara | 437/228 |
| 5,439,764 | 8/1995 | Alter et al. | 430/5 |
| 5,441,915 | 8/1995 | Lee | 437/195 |
| 5,459,093 | 10/1995 | Kuroda et al. | 437/195 |
| 5,529,862 | 6/1996 | Randall | 430/5 |
| 5,597,668 | 1/1997 | Nowak et al. | 430/5 |

OTHER PUBLICATIONS

S. Wolf, "Silicon Processing for the VLSI Era, vol. 1", Lattice Press, 1986, pp. 476–482.

*Primary Examiner*—John F. Niebling
*Assistant Examiner*—Ha Tran Nguyen
*Attorney, Agent, or Firm*—Anthony Grillo

[57] ABSTRACT

A method for fabricating a multi-level integrated circuit is disclosed which utilizes a grid pattern from which portions corresponding to the metal layer are selectively removed to form a mask which is subsequently used to deposit dummy features in the open areas between metal lines, thereby to allow the deposition of a substantially planar dielectric surface over the metal layers and dummy features.

8 Claims, 5 Drawing Sheets

PROCESS FOR PRODUCING MULTI-LEVEL METALLIZATION IN AN INTEGRATED CIRCUIT

This application is a continuation of application Ser. No. 08/514,902 filed on Aug. 14, 1995, which is a continuation of application Ser. No. 08/336,451 filed on Nov. 9, 1994.

TECHNICAL FIELD OF THE INVENTION

The present invention relates generally to the fabrication of integrated circuits, and, more particularly, to a process for fabricating multi-level metallization in an integrated circuit.

BACKGROUND OF THE INVENTION

As integrated circuits have continued to increase in complexity and integration density, it has become a common practice to arrange the conducting, metallization layers in multiple, vertically spaced layers insulated from one another by a dielectric layer. However, when multiple layers of dielectric and conductive material are formed, difficulties may arise, particularly in the formation of the upper metallization levels, as a result of the uneven topography of the underlying dielectric layers. When a dielectric layer is deposited over a metal conducting layer, for example, the surface of the dielectric layer exhibits peaks at the locations of the metal layers, and valleys or depressions at the open areas at which no metal layers are formed. This unevenness in the levels of the dielectric layer becomes more pronounced as the number of metallization layers increases. To minimize the effects of these irregularities in the levels of the dielectric layers and to improve lithography and metal step coverage, it is necessary to improve the planarization of the dielectric layers.

One technique that has been used to achieve greater planarization of the intervening dielectric layers is chemical mechanical polishing (CMP), which technique is often used in high-volume manufacturing in place of conventional planarization techniques, such as resist etchback. Planarization is achieved in a CMP process by polishing the dielectric surface on a rotating abrasive pad, while a slurry is applied to help lubricate and break down the bonds of the underlying surface. As the surface is polished, the peaks on the dielectric layer are polished before the valleys, resulting in a more even dielectric layer. After planarization of the dielectric layer is completed, a conductive layer is applied over the planarized dielectric layer, which is then photolithographically patterned and etched to define signal lines and conductive layer interconnects. Whereas CMP has been found to be an effective way to achieve improved planarization in a multi-level metallization integrated circuit, it is a relatively expensive process.

Another approach that has been used to achieve improved planarization in a multi-level metallization process is to deposit otherwise unused dummy lines or dummy features in the open areas between the locations of the metal lines so that subsequent dielectric deposition will not exhibit the valleys at the open areas. This has been achieved in the past by searching the entire chip layout to locate the open areas for each metallization layer, and then preparing a mask that is specific to the open area locations for that particular layer. That mask is thereafter employed along with conventional photolithographic steps to selectively form dummy lines in the open areas between metallization lines for each metallization layer. However, since each chip has a different pattern of metal lines and open areas, a unique mask must be fabricated to produce the dummy lines for each different layout based on a search of the chip for open areas. This process is relatively time consuming and costly.

It is thus an object of the present invention to provide a method for fabricating a multilevel integrated circuit that adds minimal complexity to the fabrication process and which is independent of the particular metallization line and open area patterns of the chip.

It is a further object of the invention to provide a method for fabricating metallization layers in a multi-level integrated circuit which can be implemented at the computer-aided-design (CAD) stage rather than during the processing level.

It is an additional object of the present invention to provide a method of the type described in which dummy features are implemented in open areas without the need to search the entire chip layout for open areas.

SUMMARY OF THE INVENTION

The method of the present invention provides an improved technique for forming dummy lines in the open areas between the metallization lines or patterns. The method includes the modification of a structure that includes an opaque grid pattern formed on an underlying transparent base layer. The line width and spacing between the lines of the grid pattern may be set to meet the process requirements and design rules for the particular chip and process used for its fabrication. At the CAD stage of the layout design of each metallization layer, the pattern of the metal lines and interconnects of that layer is used to modify the grid pattern to remove selectively portions of the grid pattern that correspond to the pattern of the conducting lines and interconnects, leaving a transparent pattern corresponding to the conductive line pattern surrounded by the remaining portions of the opaque grid pattern. In one embodiment of the invention, the conductive pattern may be superimposed in the portion of the grid pattern that has been previously removed.

The resultant mask is then used to form the dummy features in the open areas at which the conductive lines are not present and, in one embodiment, also to form the metal lines, in each case by otherwise conventional deposition, lithography and etching steps. The resulting conductive layer and intermediate dummy features, which are at substantially the same level, are then covered by a dielectric layer, which exhibits a relatively smooth upper surface as a result of the relatively even levels of the underlying conductive metal and dummy layers.

To the accomplishment of the above and to such further objects as may hereafter appear the present invention provides an improved method for fabricating a multilevel metallization layer in an integrated circuit substantially as claimed and described in the following specification considered with the accompanying drawings in which:

DETAILED DESCRIPTION OF THE INVENTION

Figure 1:
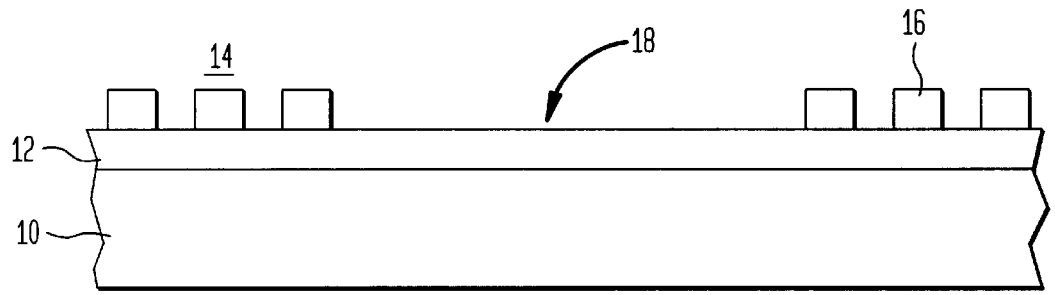
FIG. 1 is a cross-sectional view of an integrated circuit illustrating two metallization line patterns formed on a dielectric surface spaced by an open area.
Figure 2:
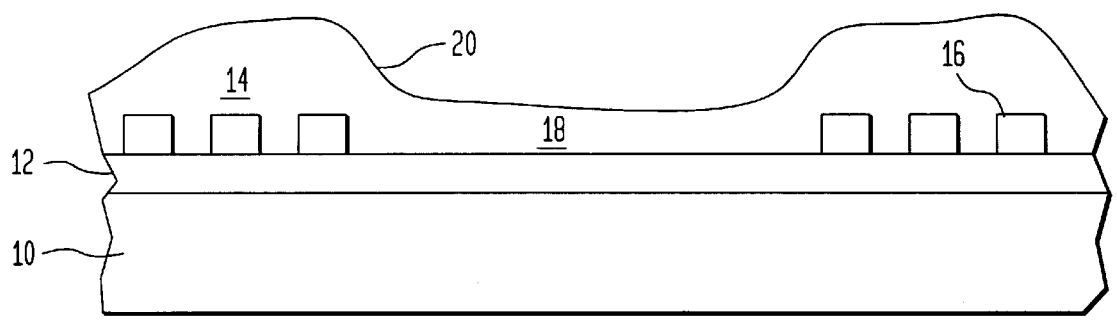
FIG. 2 is a cross-sectional view similar to FIG. 1 following the deposition of a dielectric layer over the metallization layer and open area.

The problem solved by the method of this invention is illustrated in FIGS. 1 and 2. FIG. 1 shows a portion of an integrated circuit including a substrate 10, which typically contains MOS transistors (not shown). An insulating dielectric layer 12, which typically consists of silicon dioxide or silicon nitride, is deposited on the upper surface of the substrate 10 and spaced metal lines, 14, 16, typically made of aluminum, are selectively deposited on the surface of dielectric layer 12 by known masking and deposition techniques. The region between the metal lines 14, 16, is designated as an open area 18. The distance between metal lines 14, 16, i.e. the open area 18, is typically far greater than the spacing between adjacent metal lines, which is typically 0.5 micron.

As shown in FIG. 2, a second dielectric layer 20 is deposited over the underlying metal lines 14, 16 and open area 18, typically by the use a chemical vapor deposition (CVD) process. As shown in FIG. 2, the surface of dielectric layer 20 is characterized by a rippled surface having peaks where it overlies metal layers 14, 16 and a reduced height or valley in the open area 18. These irregularities or unevenness in the level of dielectric layer 20 may produce breaks in an overlying metallization layer, especially when signal lines traverse a step in the underlying surface.

Figure 3:
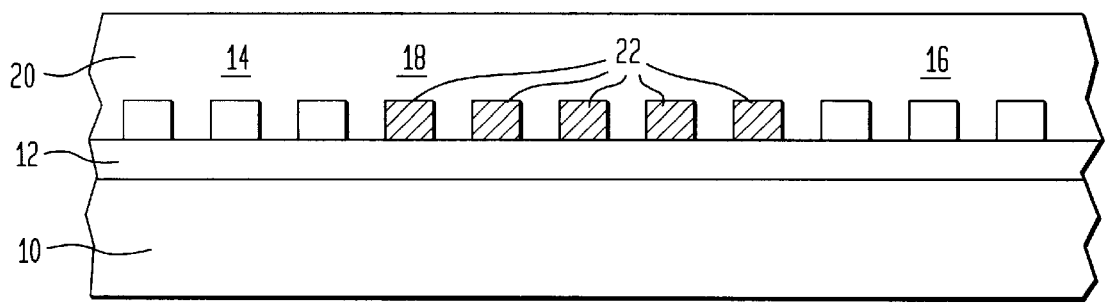
FIG. 3 illustrates the formation of dummy features in the open area to produce an increased planarization of the overlying dielectric layer.

As shown in FIG. 3, one approach to prevent the formation of the unevenness in the dielectric layer 20, i.e., to achieve improved planarization of the dielectric layer, is to form dummy lines or features, that is, otherwise unused features 22 in the open area 18 of substantially the same height and spacing as the metal lines 14, 16, so that the overlying dielectric layer 20 is essentially planar or even and free of the peaks and valleys as in FIG. 2. The dummy features 22 may either be made of a suitable metal or polysilicon or a dielectric material. In the past, these dummy features were formed by performing a search of each metallization layer to locate the open areas at which it was desired to form the dummy features. A mask then had to be specifically fabricated in accordance with each of the particular metallization pattern used in the chip. These masks were used to form dummy lines in each metallization layer and were thus chip-specific and could not be used with integrated circuits that had different metallization patterns.

Figure 4:
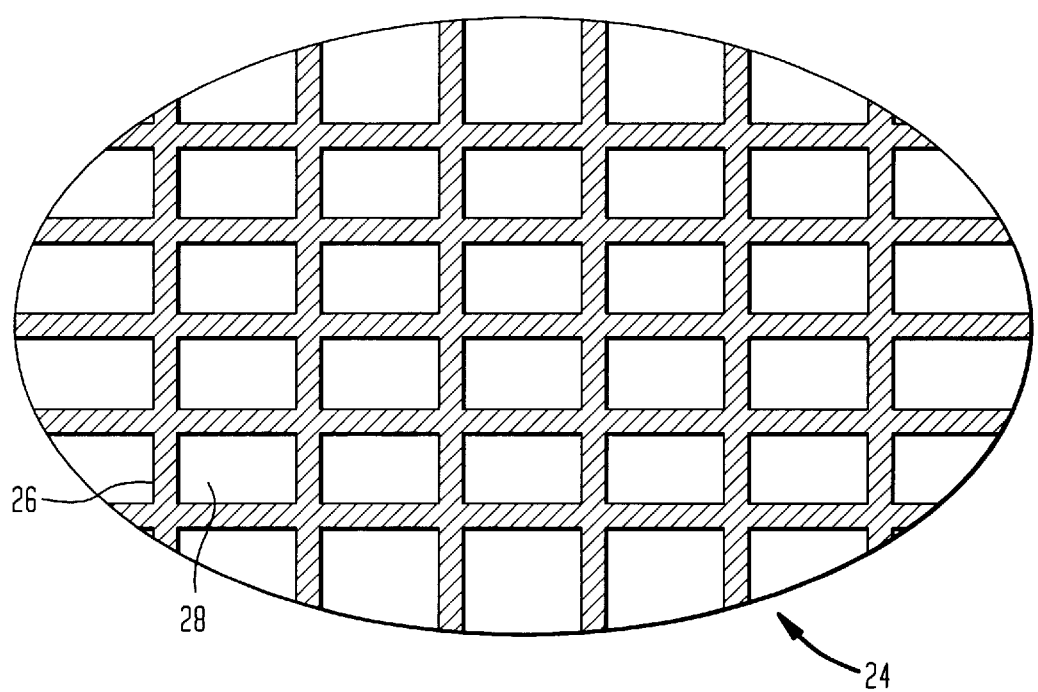
FIG. 4 is a plan view of a grid pattern structure that may be employed to form a mask that is used in the method of the present invention.

The method of the present invention provides an improved way to form the dummy features for multi-level integrated circuit and create an even planar surface in the dielectric layer. The prefered embodiment of the present invention encompasses the steps of creating the mask and using the mask to form the dummy features, as well as the mental lines, in order to fabricate an integrate circuit with even, planar dielectric layers. As illustrated in FIG. 4, a mask structure generally designated 24 that will be subsequently used in the deposition and fabrication of the dummy features initially comprises an opaque grid pattern 26 overlying a transparent base 28. The opaque grid pattern 26 may be made of a metal such as chromium and the base 28 may be made of any suitable rigid, transparent material such as glass. The line spacing and line widths of the grid pattern 26 are dependent on the type of process and design rules used in the fabrication of the integrated circuit.

Figure 5:
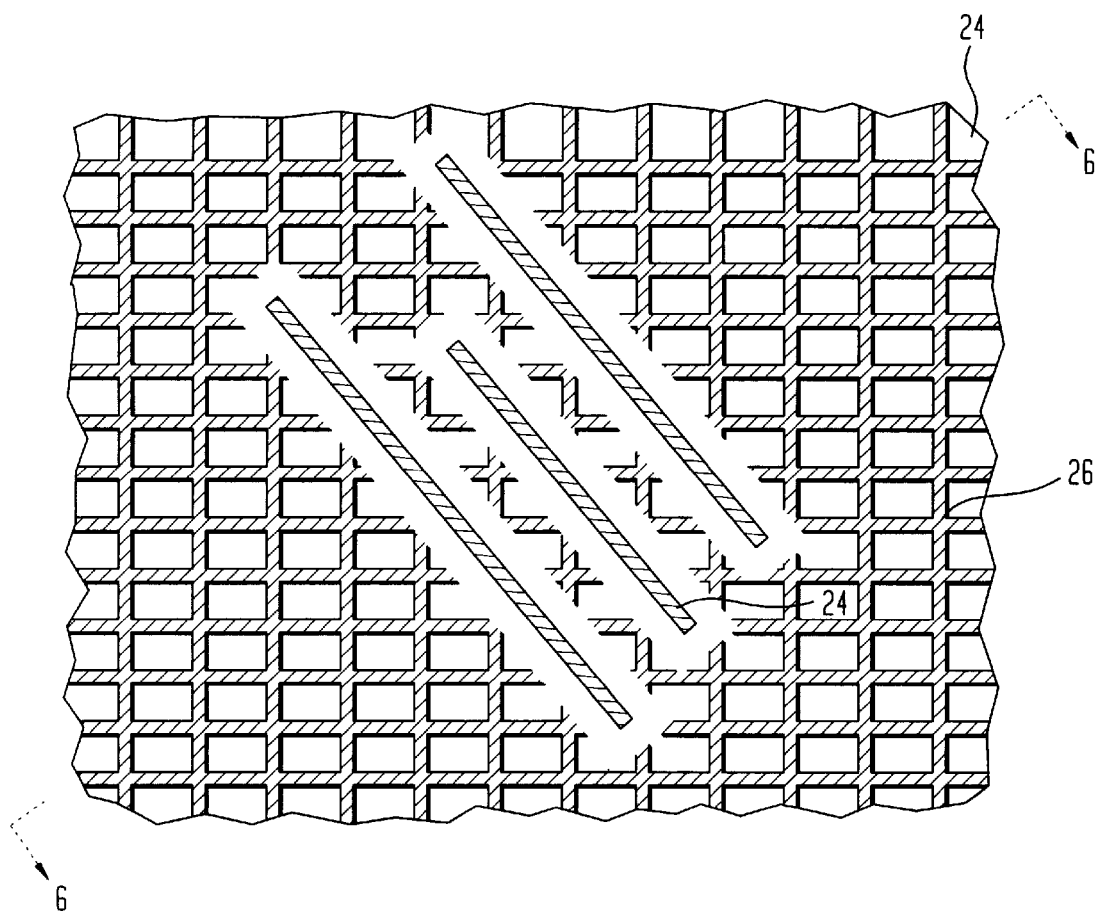
FIG. 5 is a plan view of the grid pattern structure of FIG. 4 in which the pattern of the metal lines is superimposed on the grid pattern and in which the grid lines surrounding the metal lines have been removed.
Figure 6:
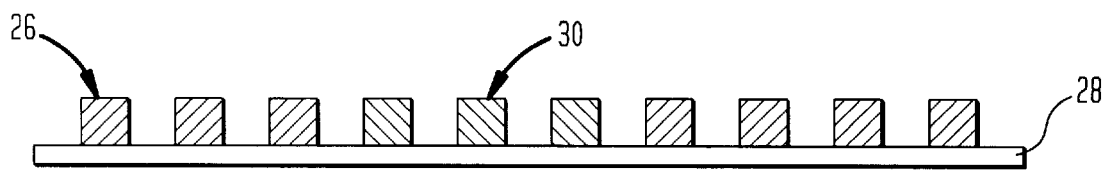
FIG. 6 is a cross-section as viewed along the direction of line 6—6 of FIG. 5.
Figure 11:
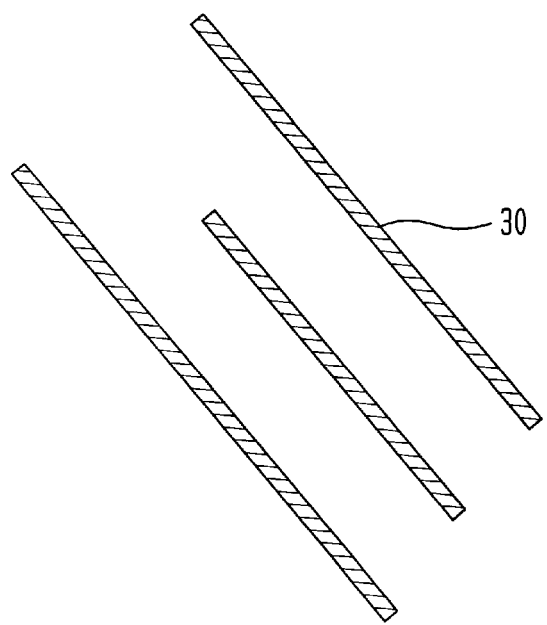
FIG. 11 is a plan view of a typical pattern of metal lines that can be used in the formation of the mask in FIGS. 5 and 8.

As in the embodiment of the mask illustrated in FIG. 5, the CAD data of the pattern of each metallization layer, such as the one shown in FIG. 11, is employed to superimpose the pattern of the metal lines 30 along with a suitable spacing over the grid pattern 26, and removing portions of the grid pattern 26 at the locations of the superimposed master metal lines, thereby to produce the mask shown in FIGS. 5 and 6, which consists of the opaque metallization line pattern 30 and remaining opaque grid pattern 26.

More specifically, during the layout design of the conductive metallization layer, an area surrounding the metal lines 30 is marked by the CAD system as an area which is not to contain the grid pattern 26. Typically, the CAD system locates this grid-free area by extending the x-y coordinates of the signal lines in both the positive and negative directions in order to create an area similar in form to the metal lines in the grid pattern 26, shown in FIG. 5.

Figure 7:
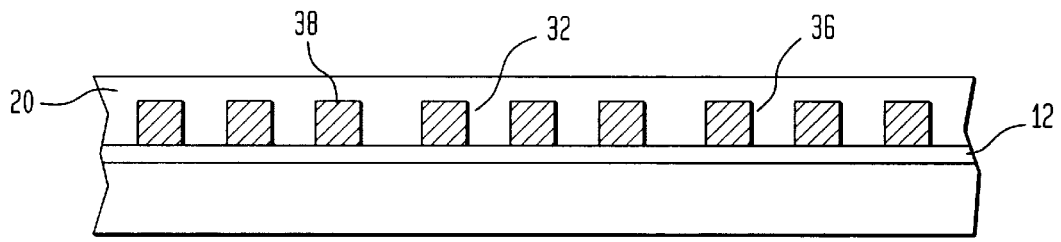
FIG. 7 is a cross-section of an integrated circuit in which metal lines and dummy features are formed by the use of the mask of FIGS. 5 and 6 in accordance with an embodiment of the present invention.

The thus-formed structure of FIG. 5 is used as a mask to transfer the modified grid pattern to form the metallization layers 34 and 36 and intermediate dummy features 32 shown in FIG. 7, by various techniques known to those skilled in the art, such as selective deposition and resist etchback. The mask layout is preferably transferred by photolithographically patterning the photoresist and by etching away the exposed metal layer except at the opaque portions of the grid pattern to define the metal line pattern and dummy features at the locations of the remaining opaque grid pattern in a single lithography operation.

As shown in FIG. 7, the metal lines 34, 36 and dummy lines 32 are formed of the same metal (e.g., aluminum) of substantially the same height. A dielectric layer 38 is then deposited over the metal lines 34, 36 and dummy lines 32. As also shown in FIG. 7, the formation of the dummy features 32 in the open areas between the metal lines 34, 36 by the use of the mask of FIGS. 5 and 6 creates a relatively smooth or planar upper surface of the overlying dielectric layer 38 by filling in the open areas between the master metal lines.

Figure 8:
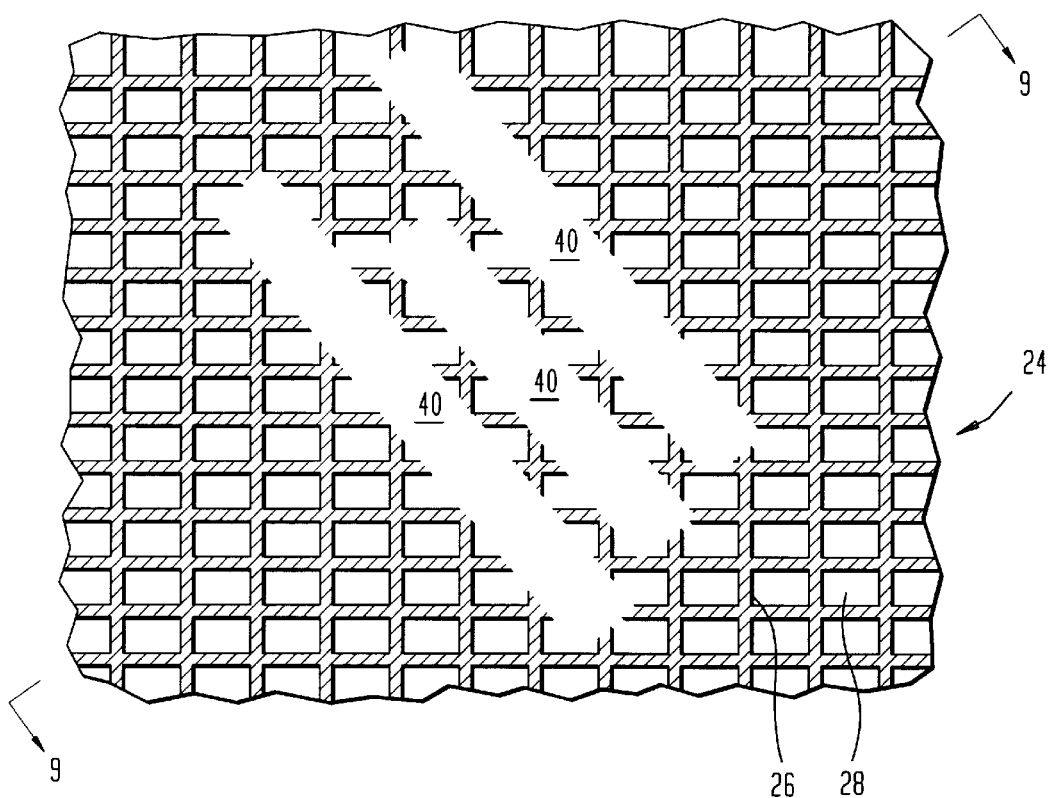
FIG. 8 is a plan view of a mask similar to FIG. 5, except that the pattern of the master metal lines has been removed from the grid pattern.
Figure 9:
FIG. 9 is a cross section viewed along the line 9—9 of FIG. 8.
Figure 10:
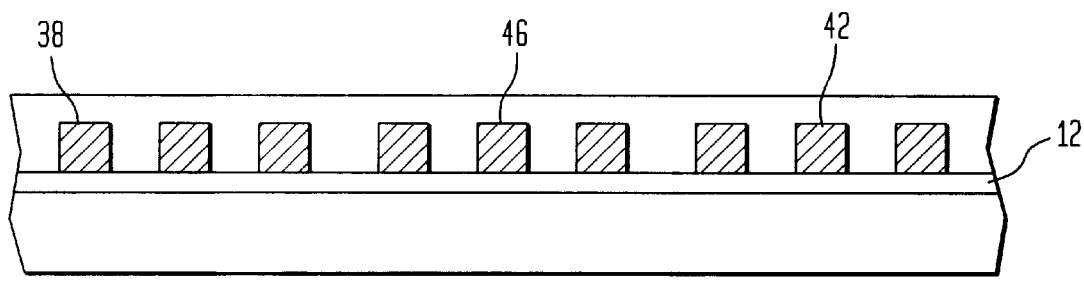
FIG. 10 is a cross section of a dielectric layer overlying a metal layer and intermediate dummy features as formed by the use of the mask of FIG. 8.

In a second embodiment of the present invention, the dummy features in the open areas are formed in a separate step from the formation of the metal lines. The separate step uses the mask with a pattern, as shown in FIGS. 8 and 9, and creates the dummy features 42, 44 on the dielectric layer in the integrated circuit of FIG. 10 through conventional deposition, lithography and etching. In this embodiment, the dummy feature may be made by either the deposition of a dielectric material or metal. Thereafter, the mask of FIG. 11 is used to form the metal lines 46 of the same height as the dummy features 42, 44 so that, as before, a smooth planar dielectric layer 30 can be deposited over the thus-formed metallization layer and dummy features.

It will be apparent to those skilled in the art that the process of the present invention process described above can be used with any layout or design without the need for a search of the layout to locate the open areas at which the spacing between master metal lines is relatively large. The global application of a grid pattern modified in the CAD stage to all open areas, has the advantage of eliminating the need for a costly and time-consuming search for specific open areas in the chip layout.

It will also be apparent that whereas the invention has been particularly described with reference to presenting preferred embodiments, various changes in form and detail may be made therein without necessarily departing from the spirit and scope of the invention.

We claim:

1. A method of fabricating a multilayered integrated circuit in which a plurality of patterns of conducting material are selectively formed on at least one dielectric layer of said integrated circuit comprising the steps of:

creating a mask by forming a first opaque pattern over a transparent base wherein said first opaque pattern being a grid selectively removing portions of opaque regions forming a plurality of transparent regions of said transparent base corresponding to said plurality of patterns of conducting material;

forming a second opaque pattern on said mask corresponding to the pattern of said conducting material in the region from which said first opaque pattern material is removed;

depositing, in a single deposition, a space filling material as an unused feature on said at least one dielectric layer corresponding to said opaque pattern of said mask, and said conducting material on said first at least one dielectric layer corresponding to said second opaque pattern in said plurality of transparent regions of said mask.

2. The method of claim 1, in which said unused feature formed by said space filling material is of substantially the same height and spacing as said conducting material.

3. The method of claim 1, further comprising the step of depositing at least another dielectric layer of substantially uniform height over said previously deposited conducting material and said space filling material.

4. The method of claim 3, in which said unused feature formed by said space filling material is of substantially the same height and spacing as said conducting material.

5. The method according to claim 1, wherein said step of depositing, in a single deposition, comprises photolithographically patterning a photoresist and etching away an exposed metal layer on said dielectric layer except at opaque portions of said mask to thereby define said conducting features and said space filling material on said dielectric layer.

6. The method according to claim 1, wherein each of said conductive features comprises a line of conductive material.

7. The method according to claim 1, wherein said space filling material is of substantially the same height as said conductive features.

8. A method of fabricating a multilayered integrated circuit in which a plurality of conductive features are selectively formed on at least one dielectric layer of said integrated circuit, said method comprising the steps of:

creating a mask by forming, during a computer-aided design (CAD) stage, a first pattern associated with space filling material to be formed on said at least one dielectric layer, wherein said first pattern being a grid and modifying said grid pattern in the CAD stage by removing portions of said first pattern to form a plurality of regions devoid of said first pattern, and then superimposing, during the CAD stage, a second pattern on said first pattern such that said second pattern is within said regions from which said grid pattern is removed, wherein said mask is formed with first and second opaque patterns over a transparent base corresponding to said first and second patterns, respectively, formed in the CAD stage; and employing said mask to form, on said at least one dielectric layer in a single operation, a space filling material as an unused feature corresponding to said first opaque pattern, and said plurality of conductive features corresponding to said second opaque pattern of said mask.

\* \* \* \* \*